(12) United States Patent
Choi

(10) Patent No.: US 7,772,527 B2
(45) Date of Patent: Aug. 10, 2010

(54) HEAT REFLECTOR AND SUBSTRATE PROCESSING APPARATUS COMPRISING THE SAME

(75) Inventor: Hoon Choi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1138 days.

(21) Appl. No.: 11/405,563

(22) Filed: Apr. 18, 2006

(65) Prior Publication Data
US 2006/0249695 A1 Nov. 9, 2006

(30) Foreign Application Priority Data
May 4, 2005 (KR) .................. 10-2005-0037453

(51) Int. Cl.
F27B 5/06 (2006.01)
F27B 5/14 (2006.01)
F27D 19/00 (2006.01)
F21V 7/00 (2006.01)
F21V 7/10 (2006.01)
F21V 7/16 (2006.01)

(52) U.S. Cl. ............... 219/405; 219/411; 392/416; 392/422

(58) Field of Classification Search ............... None
See application file for complete search history.

(56) References Cited

U.S. PATENT DOCUMENTS 5,108,792 A * 4/1992 Anderson et al. ........ 427/248.1
5,179,677 A * 1/1993 Anderson et al. ........... 392/411
5,268,989 A * 12/1993 Moslehi et al. ............. 392/418
5,650,082 A * 7/1997 Anderson ................... 219/390
5,790,750 A   8/1998 Anderson
5,834,059 A * 11/1998 Anderson et al. ....... 427/255.17
6,064,799 A * 5/2000 Anderson et al. ........... 392/416
6,108,491 A   8/2000 Anderson
6,122,440 A   9/2000 Campbell
6,435,869 B2  8/2002 Kitamura
6,476,362 B1  11/2002 Deacon et al.
6,518,547 B2 * 2/2003 Takahashi et al. ........... 219/390
6,947,665 B2 * 9/2005 Garmer et al. .............. 392/411

FOREIGN PATENT DOCUMENTS

JP         60125371 A  *  7/1985
JP       2006269451 A  *  10/2006

* cited by examiner

*Primary Examiner*—Joseph M Pelham
(74) *Attorney, Agent, or Firm*—Volentine & Whitt, PLLC

(57) ABSTRACT

A substrate processing apparatus includes a process chamber including upper and lower quartz walls, a substrate support disposed in the process chamber, radiant heaters respectively provided above and below the quartz walls of the chamber, and heat reflectors disposed outside the process chamber for reflecting heat towards the substrate support. Each of the heat reflectors has heating has a first thermally reflective section oriented to reflect the heat towards an outer peripheral region of the substrate support and a second thermally reflective section oriented to reflect the heat towards a central region of the substrate support. Each heat reflector also has a reflection angle adjusting mechanism by which an angle at which the second thermally reflective section reflects heat can be adjusted. The angle is adjusted depending on the temperature distribution across the substrate so that the substrate can be processed uniformly.

9 Claims, 6 Drawing Sheets

HEAT REFLECTOR AND SUBSTRATE PROCESSING APPARATUS COMPRISING THE SAME

BACKGROUND OF THE INVENTION

1. Field of the Invention

The present invention relates to the processing of substrates such as semiconductor wafers. More particularly, the present invention relates to apparatus that heat a substrate, especially those that heat a substrate while the substrate is being processed.

2. Description of the Related Art

In general, semiconductor devices, liquid crystal displays, optical discs and the like are manufactured by subjecting a substrate to several processes such as spin-coating, exposure, deposition, and etching processes. The substrates almost always require heat treatment in the course of their processing. Thus, equipment for manufacturing such products typically includes several apparatus for carrying out the various processes on the substrates from which the products are made. And, each apparatus has a process chamber in which an atmosphere unique to the process is created.

Specifically, a vacuum is maintained in the process chamber while a substrate is processed and heated within the process chamber. In this respect, the substrate is sometimes heated by conduction by directly heating a support, such as chuck or susceptor, on which the substrate rests within the chamber. Alternatively, the substrate is sometimes heated using radiant heat. In this case, the walls of the process chamber that form the upper or both the upper and lower portions of the chamber are formed of quartz, and radiant heat is generated by lamps fixed in place outside the quartz wall(s) of the process chamber.

The most important aim in heating a substrate during processing is to heat the substrate uniformly. For example, a substrate is often processed using a gas that reacts with the substrate to form a desired pattern on the substrate. The desired pattern will not be formed precisely on the substrate if the temperature of the substrate varies across the substrate while the gas is being supplied to the substrate. In particular, the process will generate local defects on the substrate in the case in which the temperature of the substrate varies across the surface thereof during processing. These defects are exacerbated by the processes that are subsequently performed on the substrate. Ultimately, the defects bring about a failure in one of these subsequent processes or result in the production of a defective end product.

In addition, much of the heat radiating from the heater does not propagate to the substrate or does not propagate to all regions of the substrate directly. Thus, it takes a relatively long amount of time to heat the substrate to the desired temperature.

SUMMARY OF THE INVENTION

Therefore, one object of the present invention is to provide a substrate processing apparatus by which a substrate can be heated rapidly.

Another object of the present invention is to provide a substrate processing apparatus by which the temperature distribution across a substrate can be controlled.

Likewise, an object of the present invention is to provide a heat reflector which can be used to increase the rate at which a radiant heater can heat a substrate and/or which can enhance the uniformity of the temperature distribution across the substrate.

According to one aspect of the present invention, there is provided a substrate processing apparatus including a process chamber in which a substrate is processed, a substrate support disposed in the chamber, annular radiant heaters respectively disposed above and below the process chamber and oriented generally parallel to the substrate, and heat reflectors disposed outside the process chamber to reflect radiant heat emanating from the heaters away from the substrate support back towards the substrate support. The heat reflectors include a first thermally reflective section oriented to reflect a portion of the radiant heat toward an outer peripheral region of the substrate support and a second thermally reflective section oriented to reflect another portion of the radiant heat toward a central region of the substrate support.

Preferably, the walls forming upper and lower portions of the chamber are permeable with respect to radiant heat, and the radiant heaters face such walls, respectively.

According to another aspect of the present invention, there is provided a substrate process apparatus comprising a process chamber in which a substrate is processed, a substrate support disposed in the chamber, an annular radiant heater disposed outside the process chamber and oriented generally parallel to the substrate support, and an adjustable heat reflector disposed outside the process chamber at a location at which the heat reflector reflects the components of the radiant heat emanating from the heater towards the substrate support. The heat reflector includes a first thermally reflective section oriented to reflect a portion of the radiant heat toward an outer peripheral region of the substrate support, a second thermally reflective section oriented to reflect another portion of the radiant heat toward a central region of the substrate support, and at least one reflection angle adjusting mechanism for adjusting an angle at which the second thermally reflective section reflects heat toward the central region of the substrate support and hence, toward a central region of substrate when the substrate is disposed on the support.

According to still another aspect of the present invention, there is provided a heat reflector for use in a substrate processing apparatus. The heat reflector comprises an annular body and includes a first thermally reflective section and a second thermally reflective section. The first thermally reflective section is made up of a plurality of discrete first thermally reflective surfaces, and the second thermally reflective section is made up of a plurality of discrete second thermally reflective surfaces. Each first thermally reflective surface and one or more of the second thermally reflective surfaces are alternately disposed in a circumferential direction of the annular body. The first thermally reflective surfaces are all oriented to reflect heat in a first direction, and the second thermally reflective surfaces are oriented to reflect heat in second directions that are each different than the first direction.

The first direction is generally perpendicular to the annular body, and the second directions all extend towards an axis extending perpendicular to and through the center of the annular body. Preferably, the heat reflector includes adjusting mechanisms for adjusting the angles at which the second thermally reflective section reflect heat.

According to yet another aspect of the present invention, each reflection angle adjusting mechanism includes a thermally reflective plate having a fixed end and a free end, and an adjusting member operatively engaged with the thermally reflective plate such that the thermally reflective plate can be pivoted about the fixed end thereof. The adjusting member may be a screw threaded to the body of the heat reflector and engaged with the reflective plate between the fixed and free ends of the plate so that rotation of the screw pivots the reflective plate about the fixed end thereof. A reference mark can be provided on the head of the screw, and a scale can be provided on the body of the heat reflector around the head so that the angle of the reflective plate can be discerned.

BRIEF DESCRIPTION OF THE DRAWINGS

The above and other objects, features and advantages of the present invention will become more apparent to those of ordinary skill in the art by referring to the detailed description of the preferred embodiments thereof that follows as made with reference to the attached drawings in which.

DETAILED DESCRIPTION OF THE PREFERRED EMBODIMENTS

Figure 1:
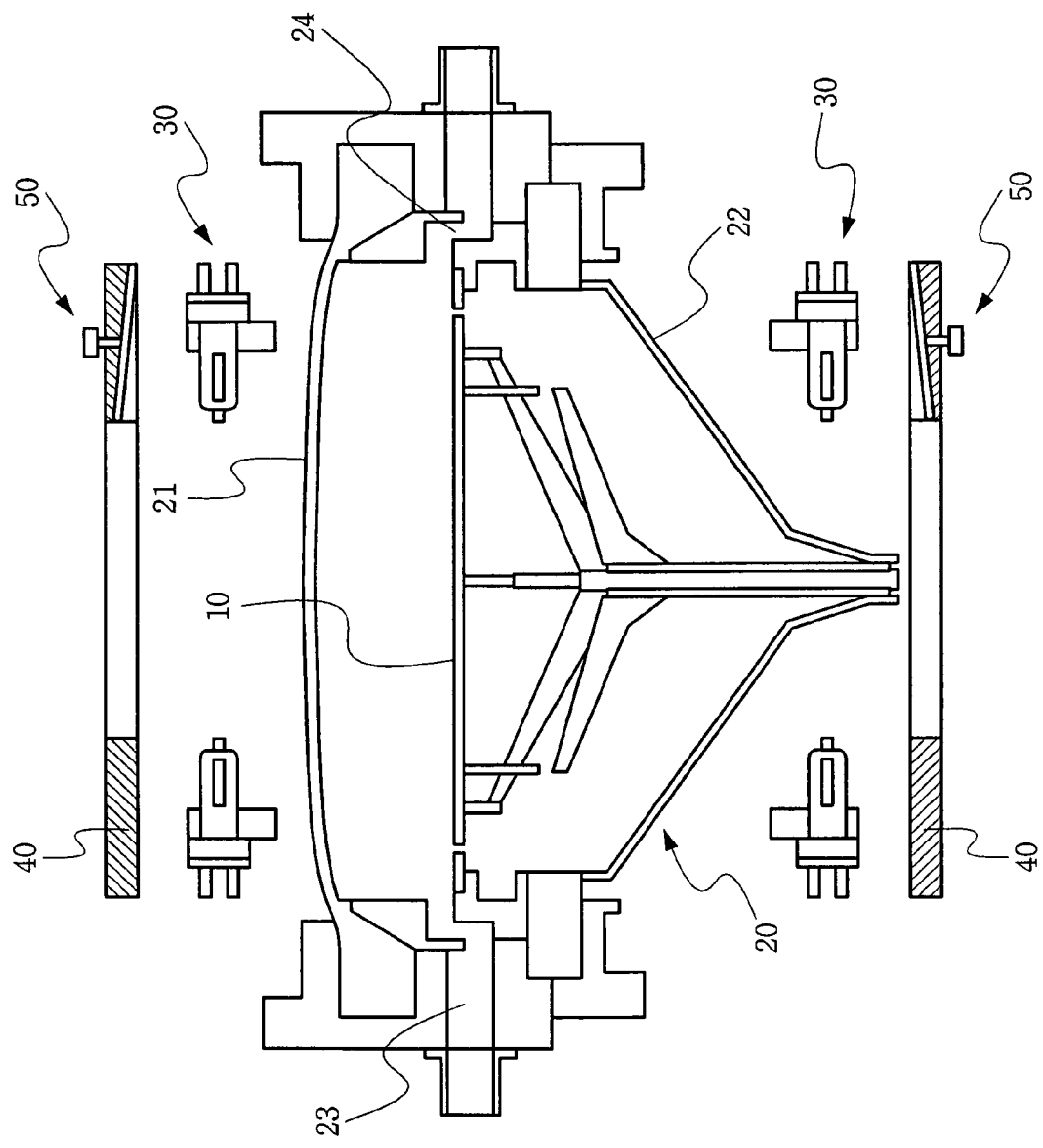
FIG. 1 is a vertical sectional view of a substrate processing apparatus according to the invention.

Referring first to FIG. 1, a substrate processing apparatus of the present invention includes a substrate support 10, e.g., a susceptor, on which a substrate is to be placed, a chamber 20 in which the substrate support 10 is disposed, heaters 30 disposed above and below the chamber 20, respectively, and heat reflectors 40 which reflect the heat generated by the heaters 30 toward the substrate support 10. The substrate support 10 is disposed at approximately the center of the chamber 20. Walls of the chamber 20 that form the upper and lower portions 21 and 22 of the chamber 20 are of quartz, namely a material that is permeable with respect to radiant heat. The walls are hermetically sealed so that a vacuum can be maintained within the chamber 20 while a substrate disposed on the substrate support 10 is being processed.

Also, the sides of the chamber member 20 are provided with a gas injection port 23 through which a process gas is injected toward a substrate on the substrate support 10, and an exhaust port 24 through which gas is discharged from the chamber 20. Preferably, the gas injection port 23 and the exhaust port 24 are disposed across from each other on opposite sides of the chamber 20. Alternatively, the exhaust port 24 may be provided at the bottom of the chamber 20.

Figure 2:
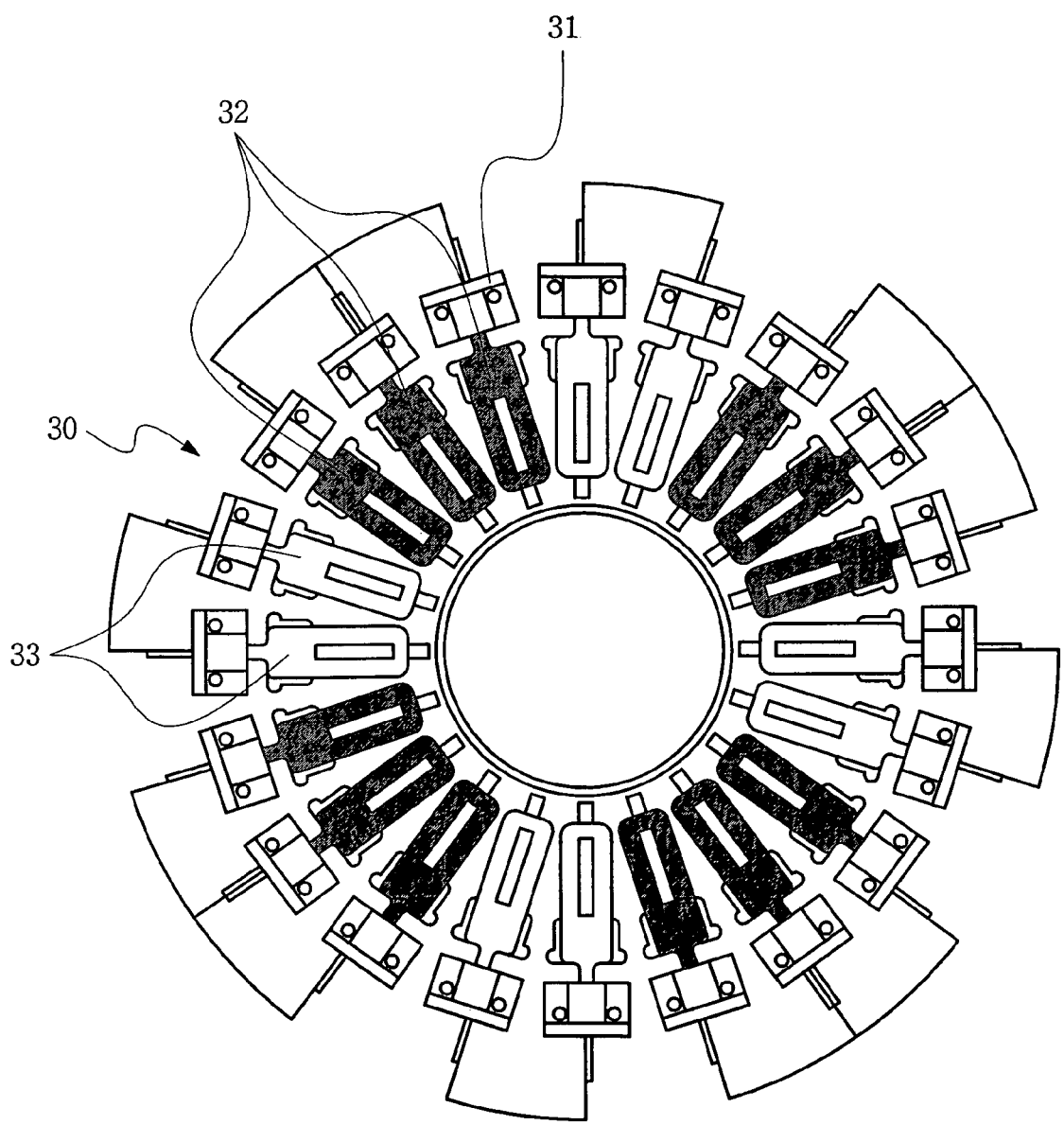
FIG. 2 is a plan view of a heater of the substrate processing apparatus according to the invention.

The heaters 30 are disposed above and below the quartz walls that form the upper and lower portions 21 and 22 of the chamber member 20, respectively. The heaters 30 heat a substrate on the substrate support 10 from outside the chamber 20, i.e., through the quartz walls forming the upper and lower portions 21 and 22 of the chamber. As shown in FIG. 2, each of the heaters 30 includes a plurality of sockets 31 which are arranged along a circle, and a plurality of lamps which are engaged with the sockets 31, respectively. The lamps may be halogen lamps, UV lamps, or other types of lamps which are particularly adept at generating heat. Also, the lamps of each heater 30 extend radially inwardly from the sockets 31 and terminate at a predetermined distance from the center of the heater 30 such that a circular opening defining the central portion of the heater 30 is inscribed by the ends of the lamps. In other words, the lamps of the heating member 30 are arranged along a circle at the outer circumference of the heater 30.

The lamps consist of inside heating lamps 32 and outside heating lamps 33. The outside heating lamps 33 are for heating the portion of the substrate that rests on an outer peripheral region of the substrate support 10 and the inside heating lamps 32 are for heating the portion of the substrate that rests on an inner or central region of the substrate support 10. Preferably, the lamps of the heating member 30 consist of sets of two or three inside (first) heating lamps 32 and sets of two or three outside (second) heating lamps 33, the sets of inside and outside heating lamps 32 and 33 being alternately disposed along the outer circumference of the heater 30.

The heat reflectors 40 are adapted to reflect the thermal components of the heat, which radiate from the heaters 30 in directions away from the substrate support 10, back toward the substrate support 10. In particular, the heat reflectors 40 are adapted to focus the heat generated by the heaters 30 on the substrate support 10.

Figure 3:
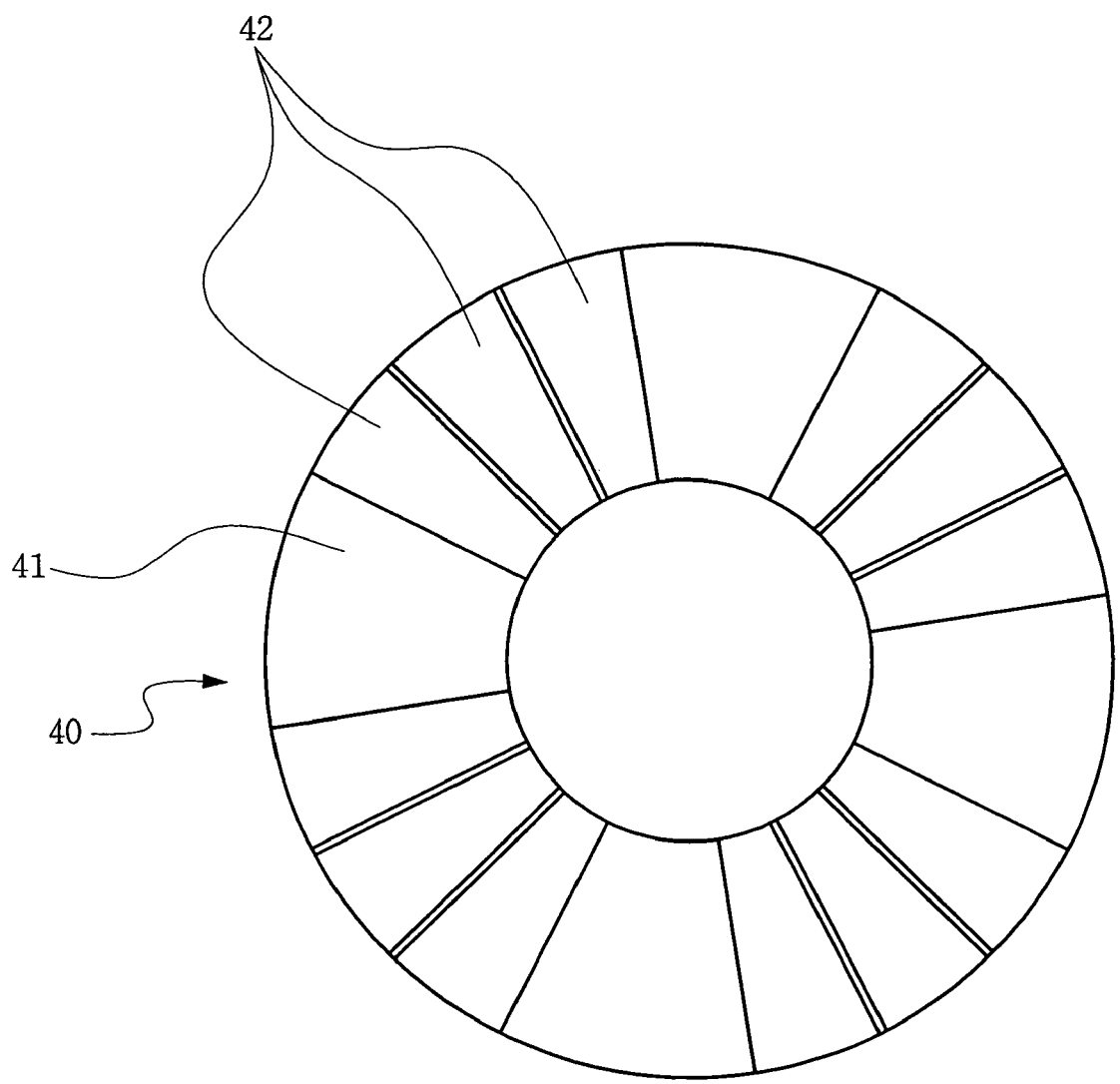
FIG. 3 is a bottom view of a heat reflector for use in the substrate processing apparatus according to the invention.

FIG. 3 is a bottom view of the upper heat reflector 40 according to the invention. As shown in FIG. 3, the heat reflector 40 comprises an annular body having first and second sections 41 and 42. Thermally reflective surfaces making up the first section 41 of the heat reflector 40 are oriented to face the outer peripheral region of the substrate support 10, and thermally reflective surfaces making up the second section 42 of the heat reflector 40 are oriented to face the inner or central region of the substrate support 10. The thermally reflective surfaces of the first section 41 of the heat reflector may be polished surfaces of the annular body such that the surfaces are especially thermally reflective, unlike the surfaces of the annular body that make up the second section 42.

The total surface area of the first section 41 of the heat reflector 40 is the same as the sum of the areas circumscribed by the sets of outside heating lamps 33, respectively. Also, the first section 41 is vertically aligned with the sets of outside heating lamps 33, respectively. More specifically, a projection of the first section 41 of the heat reflector 40 coincides with areas that are circumscribed by the sets of outside heating lamps 33, respectively. Similarly, the second section 42 of the heat reflector 40 is vertically aligned with the sets of inside heating lamps 32. More specifically, a projection of the thermally reflective surfaces of the second section 42 of the heat reflector 40 coincides with the areas that are circumscribed by the inside heating lamps 32, respectively. Moreover, whereas the surfaces of the first section 41 of the heat reflector 40 lie in a horizontal plane, i.e., a plane perpendicular to the direction in which the sections 41 and 42 are aligned with the inside and outside heating lamps 32 and 31, respectively, the surfaces of the second section 42 of the heat reflector 40 are inclined relative to the horizontal.

Furthermore, the first section 41 of the heat reflector is made up of a plurality of discrete surfaces that are coplanar. Each of these discrete surfaces, therefore, is associated with an entire set of the outside heating lamps 33 in the manner described above. On the other hand, the second section 42 of the heat reflector 40 comprises the same number of surfaces as the number of inside heating lamps 32. That is, each of the discrete surfaces making up the second section 42 of the heat reflector 40 is associated with a respective one of the inside heating lamps 32.

Figure 4:
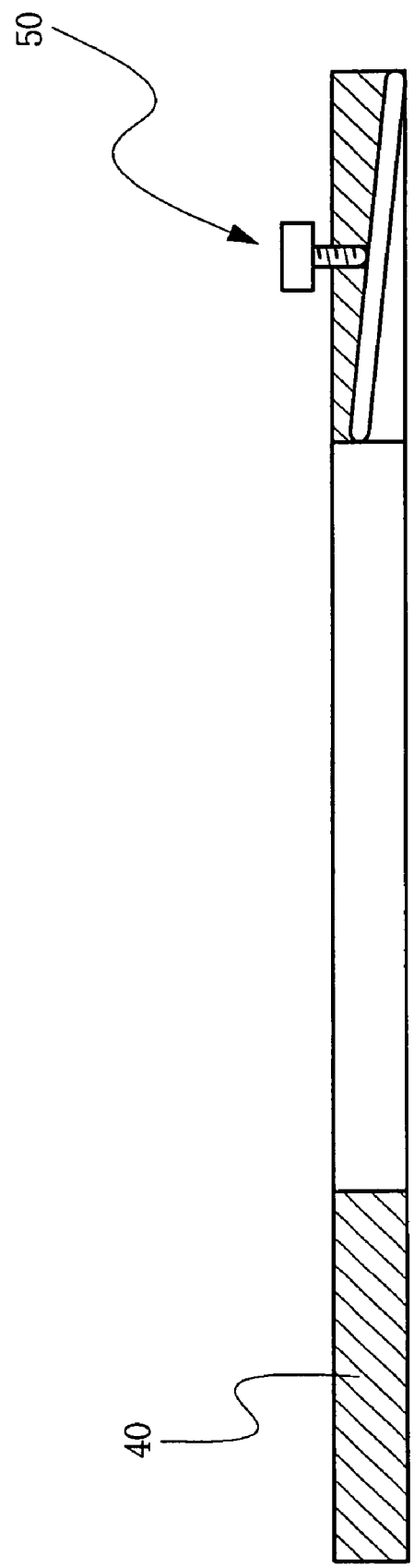
FIG. 4 is a sectional view of the heat reflector.
Figure 5:
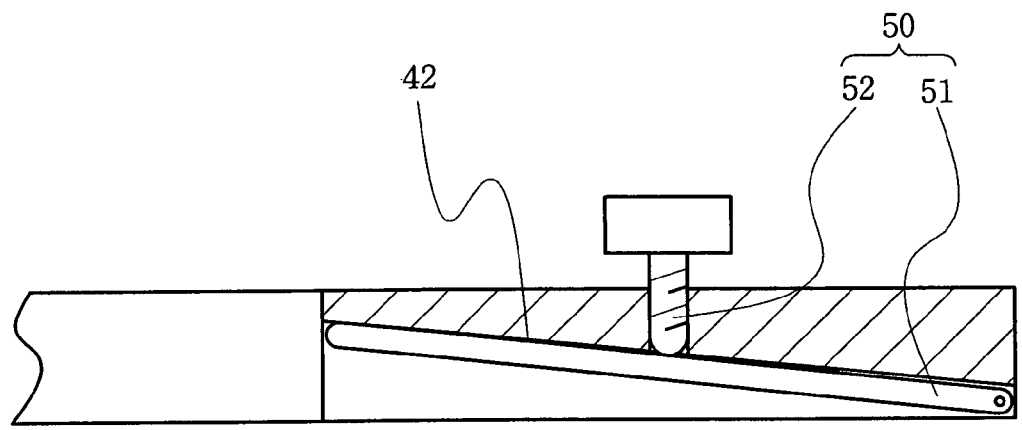
FIG. 5 is an enlarged view of an essential part of the heat reflector shown in FIG. 4.

As shown in FIGS. 4 and 5, the heat reflector 40 also includes at least one reflection angle adjusting mechanism 50 consisting of a reflecting plate 51 and an adjusting member 52 which adjusts the inclination of the adjusting plate 51.

More specifically, the reflecting plate 51 normally rests on one of the inclined surfaces of the second section 42 of the heat reflector 40, and one end of the reflecting plate 51 is attached to but is rotatably supported by the annular body of the heat reflector 40 so as to be fixed in place. A spring (not shown) is interposed between the other (free) end of the reflecting plate 51 and the annular body of the heat reflector 40 so as to bias the reflecting plate 51 against the inclined surface of the second section 42 of the heat reflector 40.

The second section 42 also has a threaded through-hole that opens to at an inclined surface of the annular body constituting the second section 42 of the heat reflector 40. The adjusting member 52 is a screw which is threaded to the annular body and extends through the annular body of the heat reflector 40. The surface of the reflecting plate 51 opposite that which faces the annular body is a polished surface so as to be particularly thermally reflective.

Figure 6:
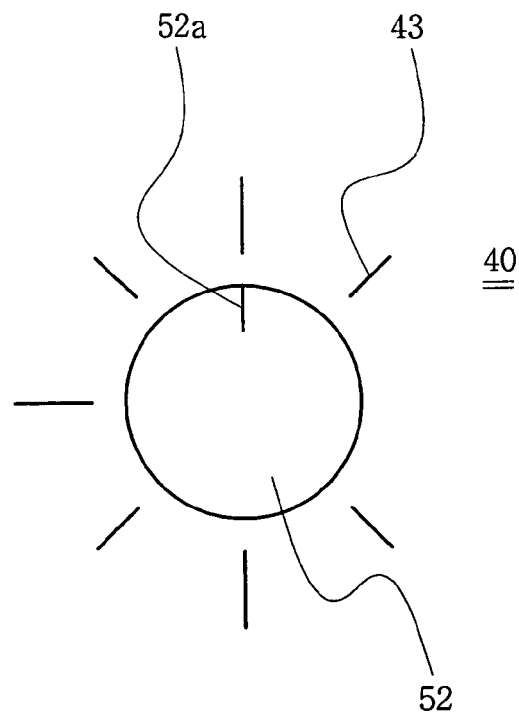
FIG. 6 is an enlarged view of a part of the heat reflector showing the head of an adjusting screw engaged with a reflecting plate, and a scale by which the reflecting plate is adjusted using the screw in accordance with the invention.

As shown in FIG. 6, a mark extending radially inwardly from the outer circumference of the head of the screw 52 serves as a reference line 52a. Furthermore, the heat reflector 40 is marked with a scale 43. The scale 43 comprises a series of lines formed on the side of the heat reflector 40 opposite that against which the reflecting plate 51 normally rests. The lines are spaced at regular intervals around the head of the screw 52 that bears the reference line 52a.

Figure 7:
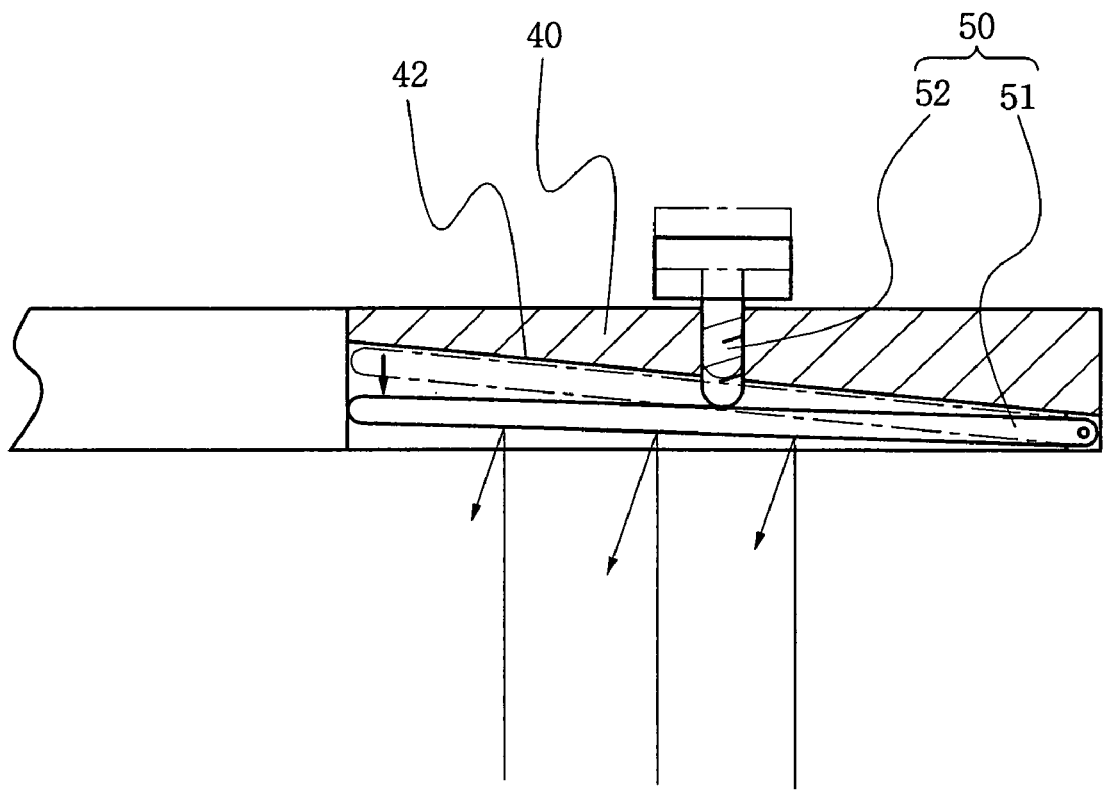
FIG. 7 is a view similar to that of FIG. 5 and showing the adjustment of a reflecting plate in accordance with the invention.

Accordingly, as shown in FIG. 7, the angle of the reflecting plate 51 can be adjusted by rotating the screw 52. Preferably, a respective screw 52 is engaged with each reflecting plate 51 so that the respective reflecting plates 51 can be independently adjusted. In addition, a respective scale 43 is provided on the body of the heat reflector 40 for each adjusting screw 52. Therefore, the angle of each reflecting plate 51 can be easily discerned with the naked eye by checking the position of the reference line 52a on the head of the adjusting screw engaged therewith relative to the scale 43 that surrounds the head.

The operation of the substrate processing apparatus will now be described in more detail.

First, a substrate is transferred into the process chamber 20 and placed on the substrate support 10. Then, an atmosphere suitable for processing the substrate is formed within the chamber 20. At this time, a process gas necessary for facilitating the process is introduced into the chamber 20 through gas injection port 23. Furthermore, the substrate and the substrate support 10 on which it rests are heated by the heat radiating from the heaters 30 disposed above and below the upper and lower portions 21 and 22, respectively, of the chamber 20. Therefore, the front and rear surfaces of the substrate are heated simultaneously.

Also, at this time, the heat radiating from the heaters 30 in directions away from the substrate is reflected back toward the substrate by the heat reflectors 40. Accordingly, the heat reflectors 40 promote the heating of the substrate, i.e., the substrate is heated more efficiently by the heaters 30. As a result, the conditions necessary for processing the substrate can be established rapidly in the process chamber 20 and hence, the process can be carried out in a relatively short amount of time.

Furthermore, the substrate must be heated uniformly if the process is to be successful, e.g., if a pattern of a sufficient quality is to be formed on the substrate. As shown in FIG. 7, if the substrate is not being heated uniformly by the apparatus, i.e., if the temperature distribution across the substrate is not uniform, a reflecting plate(s) 51 is adjusted to focus more heat on a portion(s) of the substrate having a temperature lower than that of the remainder of the substrate.

In this respect, most of the components of the processing apparatus within the chamber 20 are located closer to the inner region of the substrate than to the outer peripheral region of the substrate. Therefore, most of the local temperature variations occur at the inner region of the substrate. According to the present invention, the temperature distribution across the substrate can be easily made uniform by merely adjusting the angle of the reflecting plate(s) 51 which reflects heat toward the inner region of the substrate. In this respect, the angle of the reflecting plate 51 is finely adjusted simply by manipulating the adjusting screw 52 threaded to the heat reflector 40. Also, the marks of the scale 43 correspond to various angles of orientation of the reflecting plate 51. Thus, an operator can precisely adjust the reflecting plate 51 to a desired angle using his/her naked eye by manipulating the adjusting screw 52 to position the reference line 52a relative to a certain mark of the scale 43.

As described above, according to the present invention, the heat reflector(s) 40 allow a substrate disposed on a support 10 within process chamber to be heated rapidly and efficiently. Thus, the present invention enhances the productivity of the processing apparatus. In addition, even if the temperature distribution of a substrate heated by the heaters 30 is or becomes non-uniform, the temperature distribution can be made uniform by making a simple adjustment of the heat reflector(s) 40 using the reflecting angle adjusting mechanism (s) 50. Therefore, the present invention ensures the reliability of the process performed by the processing apparatus and minimizes the percentage of defective products, thereby further enhancing the productivity of the processing apparatus.

Finally, although the present invention has been described in connection with the preferred embodiments thereof, various changes to and alternative configurations of the preferred embodiments will be apparent to persons skilled in the art. Therefore, modifications and alternative configurations of the preferred embodiments are seen to be within the true spirit and scope of the invention as defined by the claims.

What is claimed is:

1. A substrate processing apparatus comprising:
a process chamber in which a substrate is processed, the process chamber having walls forming upper and lower portions of the chamber, respectively, the walls being permeable with respect to radiant heat;
a substrate support disposed in the chamber and on which a substrate to be processed is to be placed, the substrate support being interposed between the walls that form the upper and lower portions of the process chamber;
annular radiant heaters respectively disposed above and below the process chamber and oriented generally parallel to the surface of the substrate support on which a substrate to be processed is to rest, whereby first components of radiant heat propagate from the heaters in directions towards the substrate support so as to pass through said walls of the process chamber and heat a substrate disposed on the substrate support, and second components of radiant heat propagate from the heaters in directions away from the substrate support; and
heat reflectors disposed outside the process chamber at locations at which the heat reflectors reflect the second components of the radiant heat emanating from the heaters back towards the substrate support, the heat reflectors including a first thermally reflective section oriented to reflect a portion of the radiant heat toward an outer peripheral region of the substrate support and a second thermally reflective section oriented to reflect another portion of the radiant heat toward a central region of the substrate support, wherein the heat reflectors comprise a reflection angle adjusting mechanism by which an angle at which the second thermally reflective section reflects heat can be adjusted, and wherein the reflection angle adjusting mechanism includes a thermally reflective plate having a fixed end and a free end, and an adjusting member operatively engaged with the reflecting plate and by which the reflecting plate can be pivoted about the fixed end thereof.

2. The substrate processing apparatus according to claim 1, wherein the heat reflectors include a main body to which the fixed end of the thermally reflective plate is attached, and the adjusting member is a screw extending through and threaded to the main body, the screw engaging the thermally reflective plate at a location between the fixed and free ends thereof.

3. The substrate processing apparatus according to claim 2, wherein the adjusting screw has a head and a mark forming a reference line at an outer circumference of its head, and the heat reflector has a series of lines spaced from one another at regular intervals around the head so as to form a scale.

4. The substrate processing apparatus according to claim 1, wherein each of the annular radiant heaters comprises a plurality of lamps arranged in a circle.

5. The substrate processing apparatus according to claim 4, wherein the first thermally reflective section comprises a plurality of discrete thermally reflective surfaces, the second thermally reflective section comprises a plurality of discrete thermally reflective surfaces, respective ones of the first and second thermally reflective surfaces being alternately disposed in a circumferential direction of the heat reflectors corresponding to that of the circle along which the lamps of the radiant heaters are arranged, such that the first thermally reflective surfaces reflect heat radiating from first ones of the lamps toward outer peripheral region of the substrate support, and the second thermally reflective surfaces reflect heat radiating from second ones of the lamps toward the central region of the substrate support.

6. The substrate processing apparatus according to claim 5, wherein the heat reflectors comprise reflection angle adjusting mechanisms by which angles at which the thermally reflective surfaces of the second thermally reflective section reflect heat can be adjusted, respectively.

7. The substrate processing apparatus according to claim 6, wherein the reflection angle adjusting mechanisms comprise thermally reflective plates each having a fixed end and a free end, and an adjusting member operatively engaged with the thermally reflective plates and by which the thermally reflective plates can be pivoted about the fixed ends thereof.

8. A substrate processing apparatus comprising:
a process chamber in which a substrate is processed, the process chamber having a wall permeable with respect to radiant heat;
a substrate support disposed in the chamber and on which a substrate to be processed is to be placed;
an annular radiant heater disposed outside the process chamber, said annular radiant heater facing said wall of the process chamber that is permeable with respect to radiant heat and oriented generally parallel to the surface of the substrate support on which a substrate to be processed is to rest, whereby first components of radiant heat propagate from the radiant heater in a direction towards the substrate support so as to pass through said wall of the process chamber and heat a substrate disposed on the substrate support, and second components of radiant heat propagate from the radiant heater in a direction away from the substrate support; and
a heat reflector disposed outside the process chamber at a location at which the heat reflector reflects the second components of the radiant heat emanating from the heater back towards the substrate support, the heat reflector including a first thermally reflective section oriented to reflect a portion of the radiant heat toward an outer peripheral region of the substrate support, a second thermally reflective section oriented to reflect another portion of the radiant heat toward a central region of the substrate support, and at least one reflection angle adjusting mechanism by which an angle at which the second thermally reflective section reflects heat can be adjusted, wherein the annular radiant heater comprises a plurality of lamps arranged in a circle, wherein the first thermally reflective section comprises a plurality of discrete thermally reflective surfaces, the second thermally reflective section comprises a plurality of discrete thermally reflective surfaces, respective ones of the first and second thermally reflective surfaces being alternately disposed in a circumferential direction of the heat reflectors corresponding to that of the circle along which the lamps of the radiant heater are arranged, such that the first thermally reflective surfaces reflect heat radiating from first ones of the lamps toward outer peripheral region of the substrate support, and the second thermally reflective surfaces reflect heat radiating from second ones of the lamps toward the central region of the substrate support, and wherein the at least one reflection angle adjusting mechanism comprises thermally reflective plates each having a fixed end and a free end, and an adjusting member operatively engaged with each of the thermally reflective plates and by which the plates can be pivoted about the fixed ends thereof.

9. A heat reflector for use in a substrate processing apparatus, said heat reflector comprising an annular body and including a first thermally reflective section and a second thermally reflective section, wherein the first thermally reflective section is made up of a plurality of discrete first thermally reflective surfaces, the second thermally reflective section is made up of a plurality of discrete second thermally reflective surfaces, respective ones of the first and second thermally reflective surfaces being alternately disposed in a circumferential direction of the annular body, the first thermally reflective surfaces all being oriented to reflect heat in a first direction, and the second thermally reflective surfaces being oriented to reflect heat in second directions that are each different than said first direction, wherein the first direction is generally perpendicular to the annular body, and the second directions all extend towards an axis extending perpendicular to and through the center of the annular body, wherein the heat reflector further comprises reflection angle adjusting mechanisms by which the angles at which the second thermally reflective surfaces reflect heat can be adjusted, respectively, and wherein the reflection angle adjusting mechanisms comprise thermally reflective plates each having a fixed end and a free end, and an adjusting member operatively engaged with the thermally reflective plates and by which the thermally reflective plates can be pivoted about the fixed ends thereof.

* * * * *